United States Patent
Hasegawa

Patent Number: 5,480,489
Date of Patent: Jan. 2, 1996

[54] REACTOR FOR UNIFORM HEATING OF A SUBSTRATE

[75] Inventor: Toshiaki Hasegawa, Kanagawa, Japan

[73] Assignee: Sony Corporation, Tokyo, Japan

[21] Appl. No.: 80,706

[22] Filed: Jun. 24, 1993

[30] Foreign Application Priority Data

Jun. 29, 1992 [JP] Japan .................................. 4-194862

[51] Int. Cl.$^6$ .................................................. C23C 16/00
[52] U.S. Cl. ............................................ 118/725; 118/728
[58] Field of Search .................................... 118/724, 725, 118/728

[56] References Cited

U.S. PATENT DOCUMENTS

| 5,094,885 | 3/1992 | Selbrede | 118/725 |
| 5,119,761 | 6/1992 | Nakata | 118/725 |
| 5,233,163 | 8/1993 | Mieno et al. | 118/725 |

Primary Examiner—Olik Chaudhuri
Assistant Examiner—Brian K. Dutton
Attorney, Agent, or Firm—Hill, Steadman & Simpson

[57] ABSTRACT

A film forming device having a support bed for mounting a semiconductor substrate thereon, a heating device for heating the semiconductor substrate by way of the support bed and a source gas supply means for supplying a source gas for growing a thin film on the semiconductor substrate, wherein the support bed is divided into a contact portion in contact at least with the semiconductor substrate and a fixed portion which is disposed to the outer circumference of the support bed and fixed to side walls of a reaction chamber. Preferably, the contact portion of the support bed is made of a material having high heat conductivity, while the fixed portion is made of a material having low heat conductivity. The temperature distribution of the susceptor and the distribution for the thickness of the film formed can be improved, as well as particles can be suppressed.

10 Claims, 6 Drawing Sheets

REACTOR FOR UNIFORM HEATING OF A SUBSTRATE

BACKGROUND OF THE INVENTION

The present invention concerns a film forming device. The present invention can be utilized as a film forming device for forming various kinds of thin films, for example, upon manufacturing semiconductor devices. For instance, it can be embodied as a metal CVD device and, in particular, it is suitable as a metal CVD device, for example, for burying fine contact holes or forming refractive metal wirings.

PRIOR ART

Film forming devices for use in semiconductor devices or the like now play an important role. CVD devices are indispensable for manufacturing semiconductor devices such as ULSI.

In a film forming device typically represented by the CVD device, the temperature distribution is extremely important for a support bed for supporting a semiconductor substrate or the like on which films are formed. For instance, a blanket tungsten CVD capable of providing a connection structure with low contact resistance has been noted. Particularly, in a case of a blanket tungsten CVD technology in which a reaction restricting region (a region to which a source gas is supplied in excess and a reacting rate determines a deposition rate), it is particularly sensitive to the temperature distribution (refer, for example, to Mat. Res. Soc. Symp. Proc. VLSI V., 1990, Material Research Society "HIGH GROWTH RATE CVD-W PROCESS FOR FILLING HIGH ASPECT RATIO SUB-MICRON CONTACTS/LINES" R. V. Joshi et. al.). The blanket tungsten CVD technology has been noted as one of techniques capable of satisfying the demand for the technique of filling fine contact holes or through holes of less than 0.35 micron rules with wiring materials in a multi-layered wiring forming process in next generation ULSI.

An object of the present invention is to improve the temperature distribution of the above-mentioned semiconductor substrate support bed (hereinafter sometimes also referred to as a susceptor).

FIG. 8 shows an example proposed for cold wall type device adapted to heat a susceptor 2 by a lamp as a heating device 1 and heat a wafer 3 by the heat. FIGS. 9 and 10 show details for the portion of the susceptor 2 in the device. In this prior art, as shown in FIG. 8, a source gas is supplied from a gas supply port 6 below, and uniformly diffused by a gas plunger 71 and reaches the surface of a wafer.

By the way, as shown in FIG. 9, since the susceptor 2 is fixed to reaction chamber side walls 70, heat escapes from the susceptor 2 to the reaction chamber side walls 70 to bring about a problem that the temperature at the periphery of the susceptor 2 is lowered. Particularly, in a blanket tungsten CVD, the temperature difference has to be controlled within a range of +2° C., but the distribution of the thickness of the tungsten film was greater than ±50% in the constitution of FIG. 8.

Further, metal thin films (particularly, of tungsten) formed by the blanket CVD process are poor in the adherence to a substrate and liable to be peeled off easily. Then, an adhesion layer is necessary for forming a metal thin film on the surface of the substrate. A TiN film has often been used in a case of the blanket tungsten CVD. However, since the tungsten thin film is peeled off from a portion of a substrate in which the TiN film is not formed, it is fundamentally necessary for such a procedure as not growing the tungsten thin film.

In the device shown in FIG. 9, a purge gas from the rear face 20 of the susceptor 2 (a purge gas flow channel 11 formed in a graphite susceptor 2a is shown by reference numeral 10 in FIG. 9) is caused to flow so that no tungsten thin film is formed to a clip mark portion 22 or the rear face 24 of the wafer of a TiN sputtering device in which the TiN thin film is not formed.

SUMMARY AND OBJECT OF THE INVENTION

The object of the present invention is to attain the reduction of particles and improvement of the temperature distribution which are foregoing problems simultaneously.

That is, an object of the present invention is to provide a film forming device capable of improving a temperature distribution of a susceptor, improving the distribution for the thickness of formed films and capable of preventing the film material from going around to the rear face of a substrate wafer that causes particles and improving the temperature distribution simultaneously.

Further, another object of the present invention is to provide a film forming device showing no change of thermal absorption rate, no change of temperature distribution, capable of providing stable processing, increasing the thermal absorption rate, conducting stable heating with a low electric power, less suffering from peeling of formed films and capable of suppressing particles.

For attaining the foregoing purpose, there is provided, as a first feature of the present invention, a film forming device comprising a support bed for mounting a semiconductor substrate, a heating device for heating the semiconductor substrate by way of the susceptor, and a source gas supply means for supplying a source gas for growing a thin film on the semiconductor substrate, wherein the support bed is divided into a contact portion in contact at least with the semiconductor substrate and a fixed portion disposed at the outer circumference of the support bed and fixed to reaction chamber side walls.

For attaining the foregoing object, there is provided, as a second feature of the present invention, a film forming device as defined in the first feature wherein a material having a high good heat conductivity is used as the material for the contact portion of the susceptor and a material having a low heat conductivity is used as the material for the fixed portion of the susceptor.

For attaining the foregoing object, there is provided, as a third feature of the present invention, a film forming device as defined in the second feature wherein a mechanism for introducing a purge gas is disposed between both of the portions of the divided support bed.

For attaining the foregoing object, there is provided, as a fourth feature of the present invention, a film forming device as defined in the any of first to third features wherein the device is embodied as a metal thin film forming CVD device.

For attaining the foregoing object, there is provided, as a fifth feature of the present invention, a film forming device comprising a support bed for mounting a semiconductor substrate, a heating device for heating the semiconductor substrate by way of the support bed and a source gas supply means for supplying a source gas for growing a thin film on the semiconductor substrate, wherein the support bed is divided into a contact portion in contact at least with the semiconductor substrate and a fixed portion disposed at the outer circumference of the support bed and fixed to reaction chamber side walls, in which a metal thin film is formed to each of the contact portion and the fixed portion.

For attaining the foregoing object, there is provided, as a sixth feature of the present invention, a film forming device as defined in the fifth feature, wherein a material having a high heat conductivity is used as the material for the contact portion of the support bed.

For attaining the foregoing object, there is provided, as a seventh feature of the present invention, a film forming device as defined in the fifth or sixth feature, wherein the device is embodied as a blanket tungsten CVD device.

For attaining the foregoing object, there is provided, as a eighth feature of the present invention, a film forming device as defined in the seventh feature, wherein the metal thin film comprises a material having a good adhesion with tungsten and not etched upon etching tungsten.

According to the first to fourth aspects of the present invention, since the support bed is divided into the contact portion in contact at least with the semiconductor substrate and the fixed portion disposed to the outer circumference of the support bed and fixed to the reaction chamber side walls, the temperature distribution of the support bed (susceptor) is improved, the distribution of the thickness for the formed film is improved, prevention for the film material from going around to the rear face of the substrate wafer which causes particles and improvement for the temperature distribution can be attained simultaneously. According to the fifth to eighth aspects of the present invention, since the metal thin film is previously formed to the support bed (susceptor), there is no change of thermal absorption rate, the temperature distribution of the susceptor is improved, and stable processing can be applied. In addition, when the metal thin film is formed on the support bed (susceptor), the heat absorption rate is improved, and stable heating can be applied with low electric power. Further, when the thin metal film coating material is formed as a film of good adhesion, for example, with a tungsten film formed by blanket tungsten CVD, it is possible to cause the film formed to the susceptor to be less peeling and suppress the particles.

DESCRIPTION OF THE PREFERRED EMBODIMENTS

Description will now be made to preferred embodiments according to the present invention. It will be apparent that the present invention is not restricted by the following examples.

EXAMPLE 1

Figure 1:
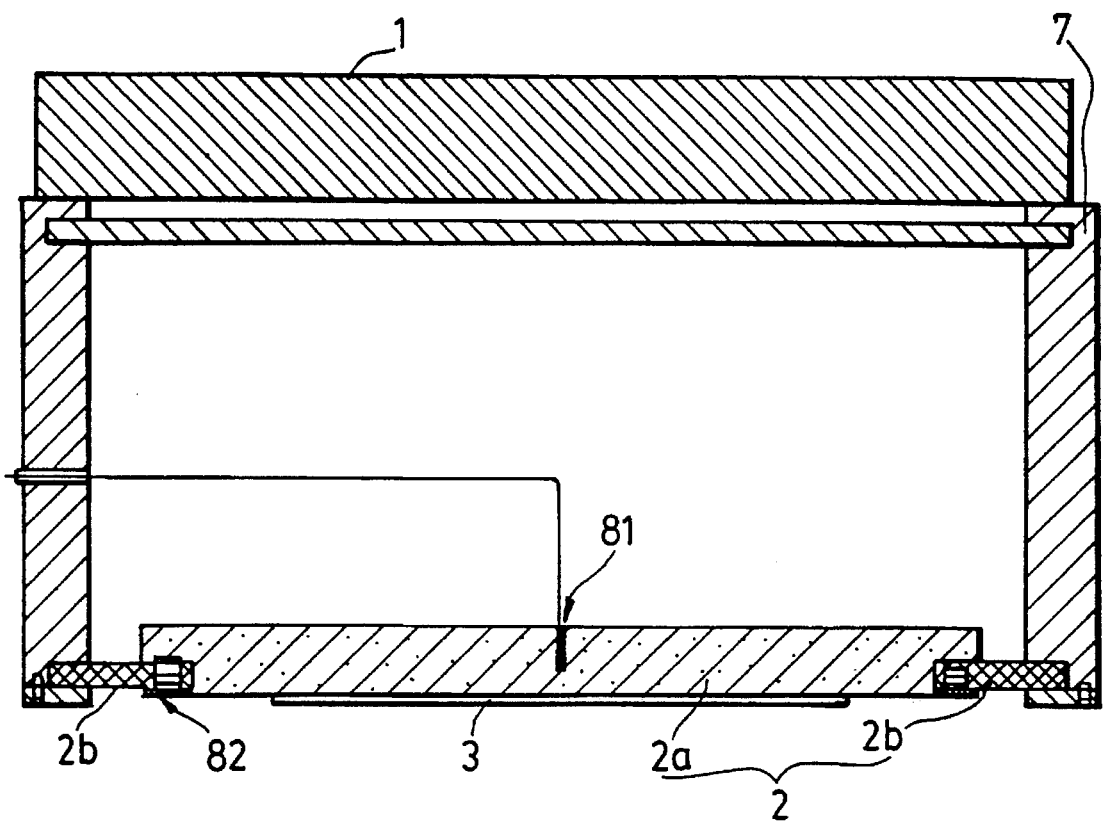
FIG. 1 is a fragmentary cross sectional view of Example 1 according to the present invention.
Figure 2:
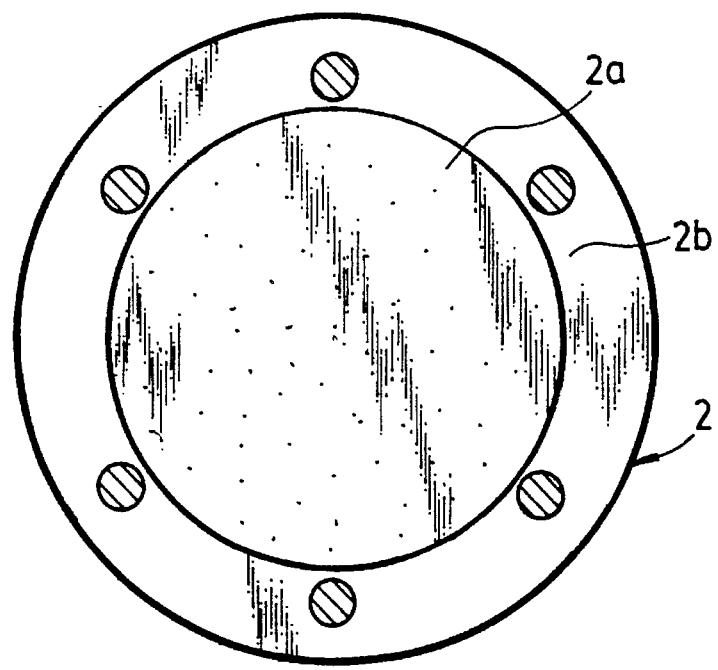
FIG. 2 is an upper plan view of a support bed in Example 1.
Figure 8:
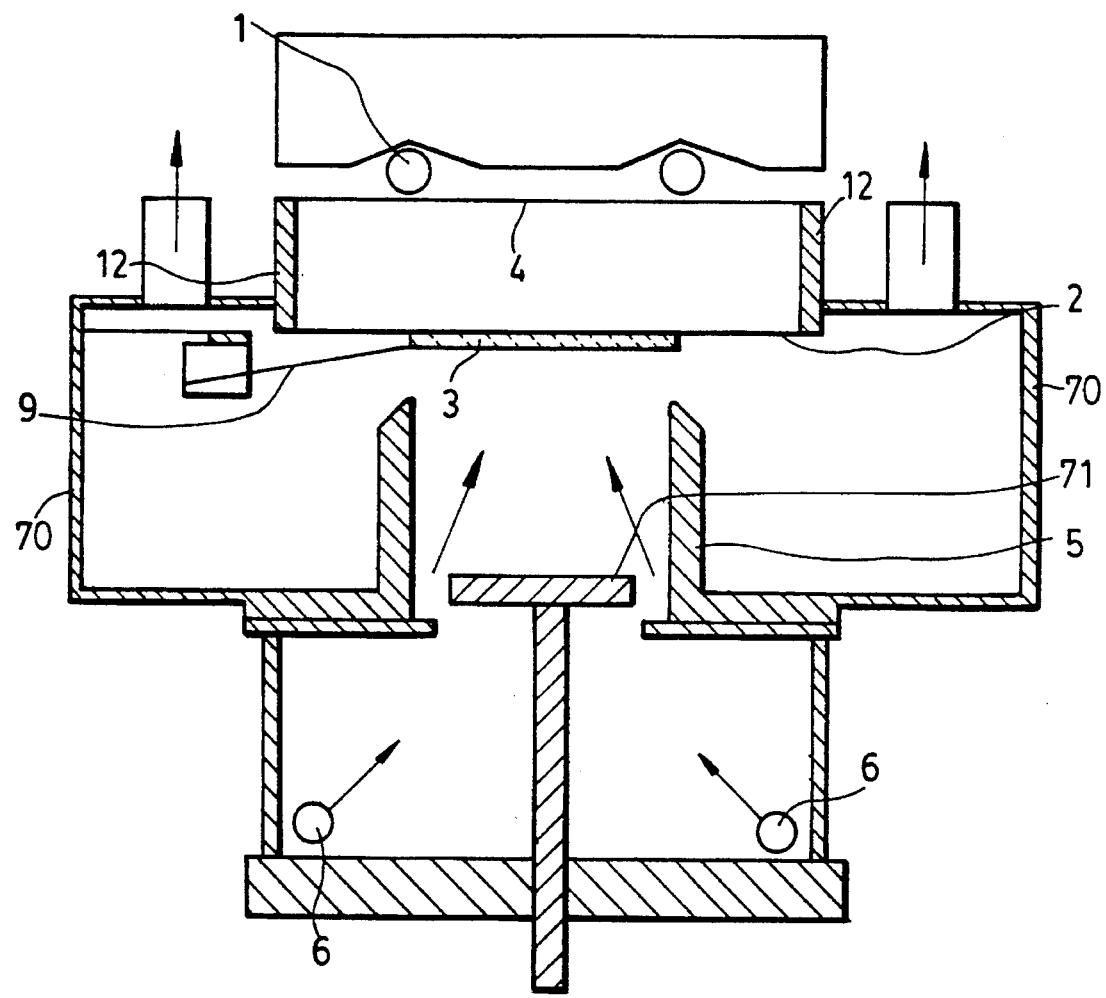
FIG. 8 is a view illustrating a CVD reactor of the prior art.
Figure 9:
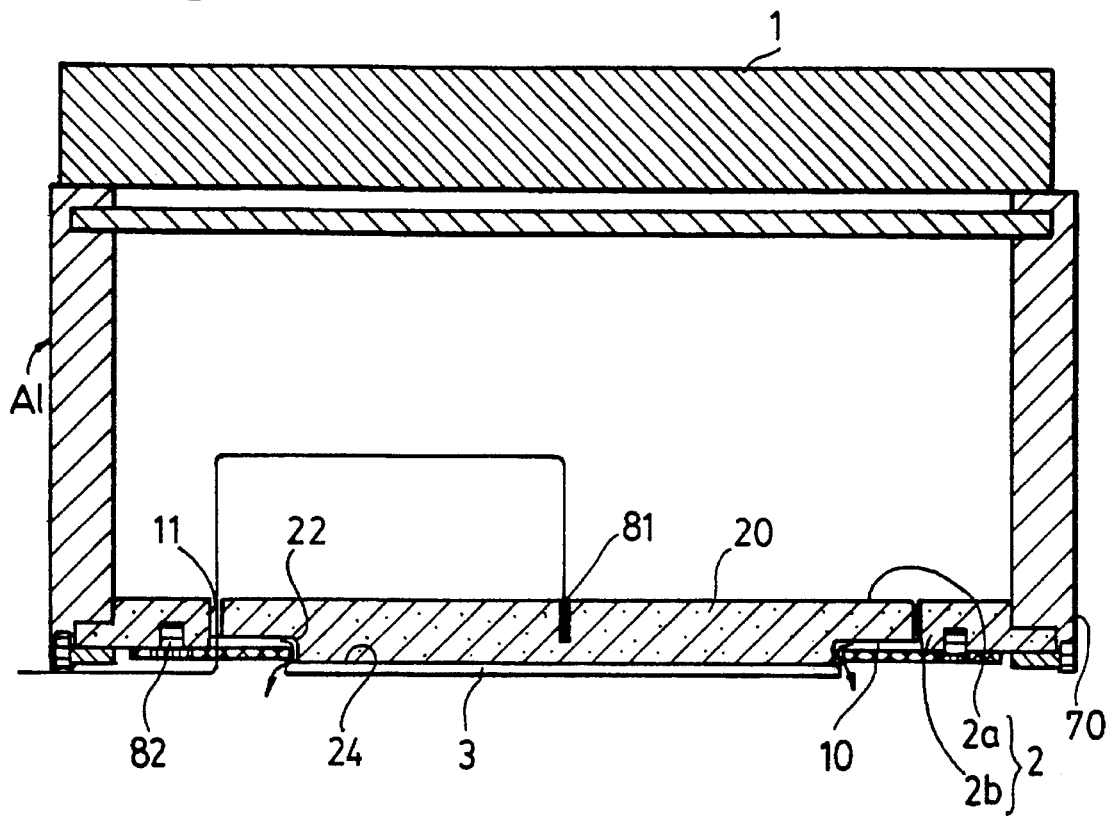
FIG. 9 is a fragmentary cross-sectional view illustrating a prior art support bed.
Figure 10:
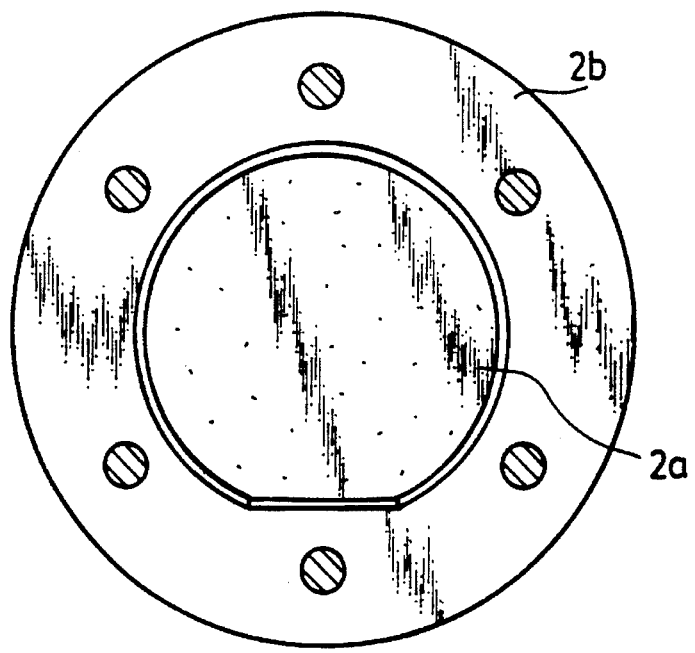
FIG. 10 is a top plan view of the prior art support bed shown in FIG. 9.

In this example, the present invention is applied to a blanket tungsten CVD device. FIG. 1 shows a fragmentary cross sectional view of this example. Support bed 2 corresponds to the support bed (susceptor) 2 which is shown in use at the top of the vector shown in FIG. 8. FIG. 2 shows an upper plan view of the support bed 2 in this example. Other portions of the overall reactor may have the same structures as those in FIG. 8.

As shown in FIG. 1, the film forming device in this embodiment comprises, a support bed 2 for mounting a semiconductor substrate 3, a heating device 1 for heating the semiconductor substrate 3 by way of the support bed 2 and a source gas supply means for supplying a source gas for growing a thin film on the semiconductor substrate 3 (for the portion, refer to FIG. 8), in which the support bed 2 is divided into a contact portion 2a at least in contact with the semiconductor 3 and a fixed portion 2b disposed to the outer circumference of the support bed 2 and fixed to the reaction chamber side walls 7.

Further, in the film forming device in this example, graphite having a high heat conductivity is used as the material for the contact portion 2a of the support bed 2, while quartz or stainless steel (SUS) of a low heat conductivity is used as the material for the fixed portion 2b of the support bed 2. This example is a face down type metal CVD device, in which a graphite susceptor as the contact portion 2a is heated through a quartz glass window 4 by heating with light (IR radiation) of a heater assembly or the like as the heating means 1, and the semiconductor device 3 (hereinafter sometimes simply referred to as a wafer) in close contact with the graphite susceptor heated by way of the heated contact portion 2a (graphite susceptor).

In this example, the susceptor as the support bed 2 comprises two portions, namely, the contact portion 2a made of graphite and the fixed portion 2b made of SUS. The fixed portion 2b constituting the outer circumferential portion is preferably made of a material having heat conductivity as low as possible. As the low heat conductive material, there can be mentioned, for example, quartz and alumina. Further, highly heat conductive graphite is preferred for the contact portion 2a constituting the inner circumferential portion as used in this example. If fabricability and strength are required, it may be made of SUS or the like. In this case, uniform radiation property is required for the lamp.

The fixed portion 2b constituting the outer circumferential portion and the contact portion 2a constituting the inner circumferential portion are secured by means of small screw 82. As the material for the screws 82, quartz, alumina or the like of low heat conductivity is preferred but other materials may also be used when a good fabricability is required.

Temperature control is attained by controlling the output of the heater using a temperature monitor having thermocouples 81.

With the constitution as described above, wafer heating with less heat escape and good uniformity can be attained in this example.

Actually, in the structure according to this example, a temperature distribution within a range of ±2° C. could be obtained at a temperature set to 450° C., and a distribution for the film thickness of less than 5% within a plain was obtained in blanket tungsten CVD. The CVD conditions in this case are as shown below.

CVD condition
First step
 Temperature: 50° C.
 Pressure: (10 kPa)
 Gas: $SiH_4/WF_6/H_2=7/10/300$ sccm
Second step
 Temperature: 50° C.
 Pressure: (10 kPa)
 Gas: $SiH_4/WF_6/H_2=0/25/500$ sccm As has been described above, in this example, since the susceptor as the support bed 2 is divided into the contact portion 2a constituting the inner circumferential portion in contact with the semiconductor substrate wafer 3, and the fixed portion 2b constituting the outer circumferential portion in contact with the cooled reaction chamber side walls 7, it is possible to prevent heat at the inner circumferential portion in contact with the wafer from escaping.

Further, since the material for the fixed portion 2b in contact with the reaction chamber side walls 7 is made of low heat conductive material, while the material for the contact portion 2a constituting the inner circumferential portion in contact with the semiconductor substrate wafer 3 is made of high heat conductive material, an effect of not escaping the heat and an effect of making the temperature distribution uniform within a wafer surface can be obtained at the same time.

That is, according to this example, since the susceptor is divided into two or more portions, namely, the outer circumferential portion and the inner circumferential portion, heat conduction is hindered at the joining portion between them to prevent the heat of the susceptor from escaping to the reaction chamber. This moderates the temperature slope in the contact portion 2a on the susceptor where the wafer is mounted and, as a result, the temperature distribution on the wafer is improved, to improve the distribution for the thickness of the CVD film.

Further, since the outer circumferential portion is made of low heat conductive material, heat can be prevented from escaping. This makes the temperature slope further moderate to improve the distribution for the film thickness. In addition, if the inner circumferential portion is made of high heat conductive material, even when lamp heating is not even, for instance, heat can be diffused instantly because of good heat conductivity, thereby attaining an effect of unifying the temperature distribution of the susceptor.

EXAMPLE 2

Figure 3:
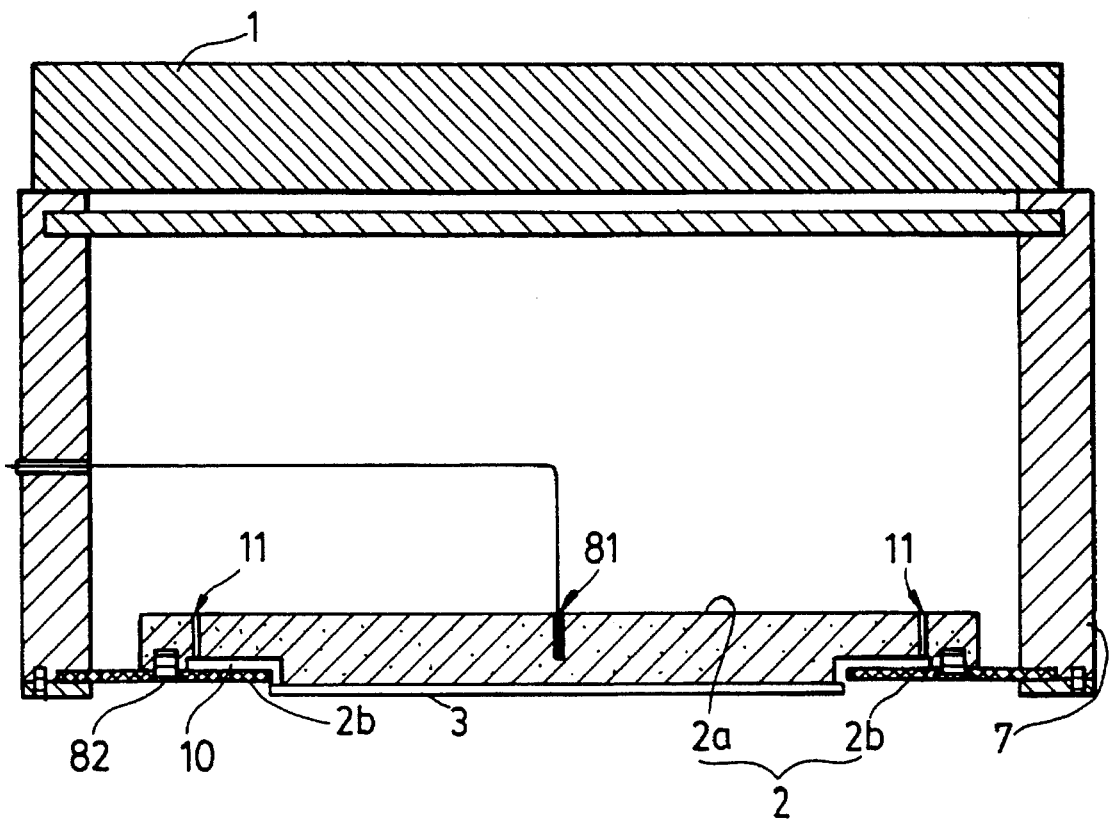
FIG. 3 is a fragmentary cross sectional view of Example 2 according to the present invention.
Figure 4:
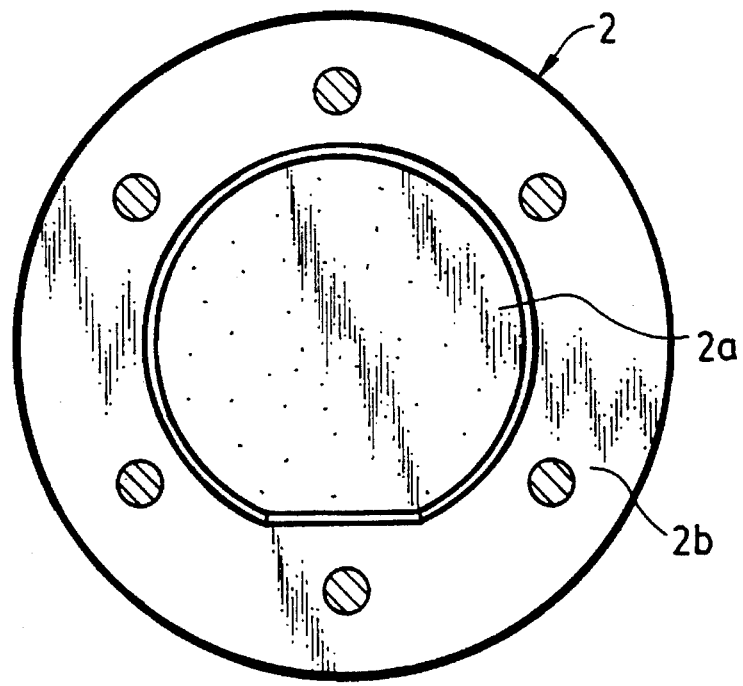
FIG. 4 is an upper plan view of a support bed in Example 2.

This example is a modification of Example 1, in which a mechanism for blowing a purge gas to the outer circumference on the rear face of the semiconductor substrate wafer as shown in FIGS. 3 and 4, is disposed to the support bed 2 (susceptor) shown in Example 1.

That is, this embodiment had a mechanism for introducing the purge gas between the portions 2a and 2b of the divided support bed 2.

More specifically, the purge gas passes through an opening 11 of 1 mm diameter formed to the contact portion 2a made of graphite, passes through a gas introduction channel 10 defined with a gap (1 mm) between a fixed portion 2b made of SUS and the contact portion 2a made of graphite and is blown only to the peripheral portion on the rearface of the wafer.

This dilutes the source gas at the periphery of the wafer to suppress the deposition of a CVD film at the periphery of the wafer. Accordingly, this can prevent the CVD film from stripping from the rear face of the wafer thereby suppressing the formation of particles.

The material for the susceptor, also as described in Example 1, may be changed properly in view of the fabricability of the strength. Preferably, the inner circumference is made of graphite, while the outer circumference is made of thin (1 mm) SUS as in this embodiment. However, quartz glass, alumina or the like is preferred for the outer circumference at the sacrifice of the fabricability.

An example of applying a blanket tungsten CVD by actually using this embodiment is shown below.

CVD condition
First step
 Temperature: 50° C.
 Pressure: (10 kPa)
 Gas: $SiH_4/WF_6/H_2=7/10/300$ sccm
 Purge gas: Ar=500 sccm
Second step
 Temperature: 450° C.
 Pressure: (10 kPa)
 Gas: $SiH_4/WF_6/H_2=0/25/500$ sccm
 Purge gas: Ar=1,000 ccs.

As a result, blanket tungsten CVD could be conducted with no peeling from the rear face of the wafer. A preferred uniform distribution of less than 5% was obtained in the same manner as in Example 1.

In this example, since a mechanism capable of blowing the purge gas to the outer circumference on the rear face of the wafer is attached to the support bed 2 (susceptor) of good temperature distribution, the source gas is diluted only at the outer circumferential portion on the rear face of the wafer, so that reaction can be suppressed and the deposition of the CVD film to the rearface of the wafer as a cause of the particles can be prevented. This makes it possible to form blanket tungsten requiring a easily peelable adhesion layer.

EXAMPLE 3

In Examples 1 and 2 described above, the fixed portion 2b constituting the outer circumferential portion of the susceptor is made of a material of low heat conductivity such as quartz or aluminum, to suppress heat escape from the outer circumferential portion. However, only with such means, if the film forming procedure is repeated, in particular, in a case where the contact portion 2a of the susceptor is made of a material of high heat conductivity such as graphite, the metal thin film sometimes grows also on graphite to change the thermal absorption rate thereby deteriorating the temperature distribution.

Figure 5:
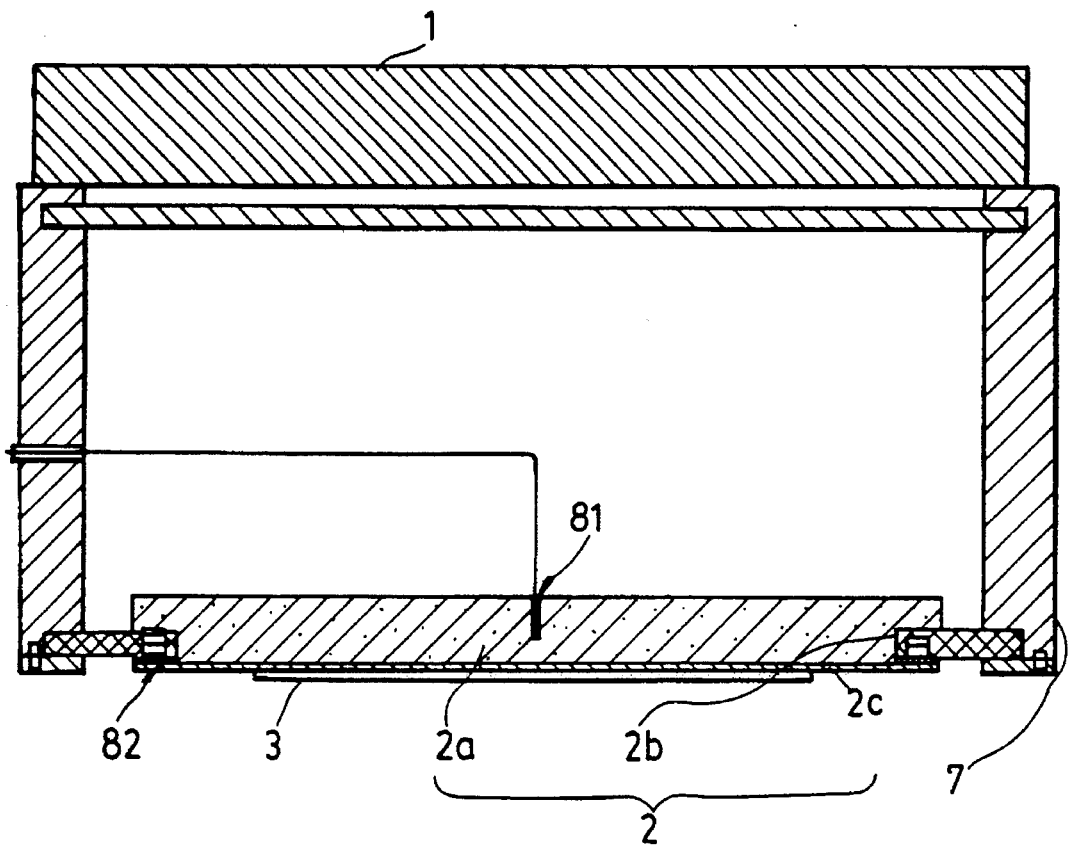
FIG. 5 is a fragmentary cross sectional view of Example 3 according to the present invention.
Figure 6:
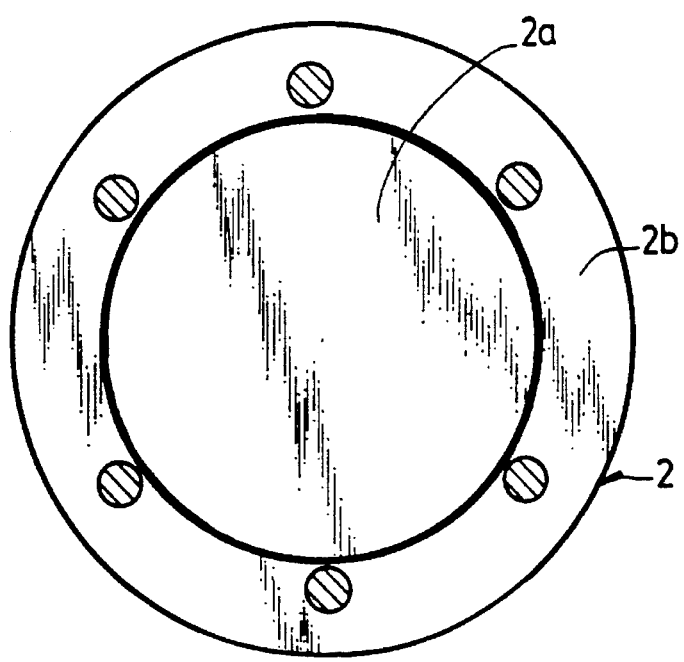
FIG. 6 is an upper plan view of a support bed in Example 3.

This example solves such a problem. FIG. 5 shows a fragmentary cross sectional view of this example and FIG. 6 shows a support bed 2 as viewed from the side of mounting the wafer.

This embodiment is a film forming device comprising a support bed 2 for mounting a semiconductor substrate 3, a heating device 1 for heating the semiconductor substrate 3 by way of the support bed 2 and a gas supply means for supplying a source gas for growing a metal thin film on the semiconductor substrate 3, in which the substrate bed 2 is divided into a contact portion 2a in contact at least with the semiconductor substrate and a fixed portion 2b disposed to the outer circumference of the outer support bed 2 and fixed to reaction chamber side walls, and a metal thin film 2c is formed to each of the contact portion 2a and the fixed portion 2b.

This embodiment shows an example of using SUS for the fixed portion 2b as the peripheral portion for preventing heat escape, and a metal thin film (W) is coated on the contact portion 2a made of graphite and in contact with the semiconductor substrate wafer 3. Any of metals may be used for coating so long as the metal causes no undesired effect on the device. For instance, there can be mentioned Al, WSi, Ti, TiSi, TiN, TiW, Cu, Co, Ni, CoSi, NiSi, Au or the like. In the case of selecting the material, it is necessary to take a sufficient consideration for the portion of the device to which the metal is used, For instance, in a step prior to gate oxidation, metal such as Al or Cu can not generally be used. Further, the metal thin film is preferably made of such a material as having good adhesion with tungsten and not etched upon etching for tungsten.

Further, in this example, graphite is used for the material of the contact portion as the inner susceptor. This is because graphite has a high heat conductivity to moderate the temperature slope. In particular, in a case of applying blanket tungsten CVD, it is preferred to use graphite for the inner susceptor to improve the temperature distribution as much as possible.

According to this embodiment, since the metal coating is applied to the outer susceptor and it is made of TiN or the like having a good adhesion with a blanket tungsten, the tungsten film can be prevented from peeling.

Namely, as has been described above, heat escape can be prevented by making the outer circumference of the susceptor with a less heat conductive material such as quartz or alumina. However, when graphite of high heat conductivity is used for the inner susceptor for improving the temperature distribution, if an IR (infrared radiation) lamp is used as the heating means, most of IR rays permeate the graphite material.

Accordingly, IR rays are directly irradiated on the wafer and the heating state changes depending on the state of the wafer. In addition, as the film forming treatment is continued, the thin film is formed also on the graphite susceptor to vary the absorption rate for infrared rays.

In view of the above, for preventing such a disadvantage, a metal thin film capable of absorbing most of the infrared rays is previously coated. This hinders the infrared rays from reaching the wafer and, even when the film forming processing is continued and a thin film is formed on the susceptor, the thermal absorption rate is constant with no change and stable heating can be applied.

On the other hand, in a case of forming a metal thin film of poor adhesion such as blanket tungsten, a film is formed also on an insulation film different from the case of selective growing. Accordingly, this results in a problem that the formed tungsten film is peeled off. In this example, since an adhesion layer such as made of TiN of good adhesion is previously coated, this problem can be overcome. Further, since TiN is less etched by a fluorine series gas, there is also an advantage that the coating is less detached also in a case of etching a tungsten film formed on the susceptor. Further, if the temperature is high, TiN is also etched with fluorine radicals and, accordingly, it is necessary to control the temperature upon plasma cleaning.

EXAMPLE 4

Figure 7:
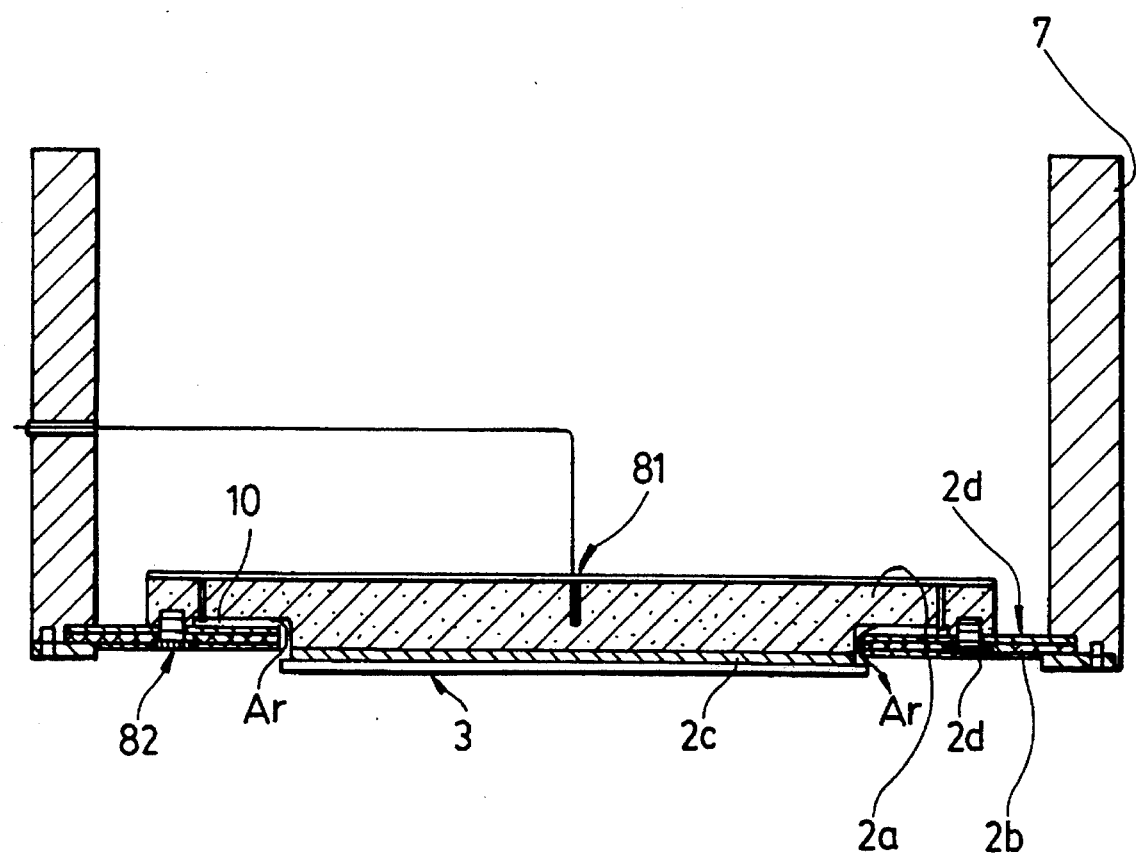
FIG. 7 is a fragmentary cross sectional view of Example according to the present invention.

Description will now be made to Example 4 with reference to FIG. 7. This example is a modification of the Example 3. The device used in this embodiment is a blanket WCVD device a structure in which a fixed portion 2b constituting the outer circumferential portion is made of quartz and a contact portion 2a constituting the inner circumferential portion is made of graphite each of which is coated with TiN or W as a metal thin film as 2c and 2d.

This device has a structure capable of diluting a source gas at the periphery with an Ar gas for preventing the blanket W from depositing to form a film on the rear face of the wafer. Further, since the outer peripheral portion is made of quartz, this can provide a greater effect of preventing heat escape than the constitution shown in SUS. Further, since the metal coating is applied, stripping of W can be prevented and particles can be reduced.

Although TiN was used on quartz in this example, TiW, TiON or W may also be used having good adhesion with blanket W.

Although W was used also for the metal coating on the susceptor in this example, the metal thin film referred to in Example 3 can of course be used.

According to the present invention, the temperature distribution of the support bed (susceptor) can be improved, the distribution of the thickness of the formed film is improved and, in addition, prevention of the film material from going around to the rearface of the substrate wafer which is a cause for particles and improvement for the temperature distribution can be attained simultaneously.

In addition, according to the present invention, it is possible to provide a film forming device with less change of thermal absorption rate and no change of temperature distribution, capable of applying stable processing, improving the thermal absorption rate and applying stable heating with low electric power, suffering from less peeling of the formed film and capable of suppressing particles.

What is claimed is:

1. A CVD reactor comprising: a reactor including a sidewall defining an inner reactor chamber, a support bed including an inner contact portion having a contact surface adapted to receive a semiconductor substrate to be coated and an outer circumferential fixed portion and means for connecting the inner contact portion to the fixed portion, the material of the inner contact portion being more heat conductive than the material of the fixed portion, the support bed being introducible into the reactor so that the outer fixed portion is in contact with a reactor sidewall and the contact surface of the inner contact portion is received within the reactor chamber, the reactor further including a heater for heating the inner contact portion of the support bed to substantially uniformly heat the semiconductor substrate positioned thereon to provide a heated semiconductor substrate, means for supplying a source gas into the reactor chamber to permit a substantially uniform film to be formed from the source gas on the heated semiconductor substrate positioned on the contact surface, and said reactor further comprising means for blowing a purge gas between the outer fixed portion and the inner contact portion of the support bed and toward an outer circumference of a rear face of the heated semiconductor substrate mounted on the contact surface.

2. A CVD reactor useful for forming a film on a surface of a semiconductor substrate, said reactor comprising:

the reactor including a sidewall defining an inner reactor chamber, a support bed having a substrate receiving surface for mounting the semiconductor substrate thereon in the reactor chamber, a heating device for heating said semiconductor substrate by way of said support bed and a source gas supply means for supplying a source gas to the reactor chamber for growing the film on the semiconductor substrate, said support bed being divided into a central contact portion for receiving the semiconductor substrate and a fixed portion disposed along the outer circumference of the support bed and being fixed to the sidewall of the reactor, the material of the central contact portion being more heat conductive than the material of the fixed portion and the substrate receiving surface of said support bed defined by the central contact portion and the fixed portion, each having a film layer defined thereon.

3. A reactor as defined in claim 2, wherein graphite is used as said material for the central contact portion of the support bed, and quartz or alumina is used as said material for the fixed portion.

4. A reactor as defined in claim 2, further comprising means for introducing a purge gas between the outer fixed portion and the central contact portion of the support bed.

5. A reactor as defined in claim 4, further comprising means for blowing the purge gas to an outer circumference of a rear face of the heated semiconductor substrate mounted on the substrate receiving surface.

6. A reactor as defined in claim 4, wherein the purge gas is argon.

7. A reactor as defined in claim 2, wherein the reactor is a metal film forming CVD device.

8. A reactor as defined in claim 2, comprising a blanket tungsten CVD reactor.

9. A reactor as defined in claim 2, wherein the film layer is made of a material adherent to tungsten and not etched upon etching of tungsten.

10. A reactor as defined in claim 14, wherein the thin film layer is made of TiN.

* * * * *